United States Patent
Lee

(10) Patent No.: US 6,277,677 B1
(45) Date of Patent: Aug. 21, 2001

(54) METHOD OF MANUFACTURING A SEMICONDUCTOR DEVICE

(75) Inventor: Jung Ho Lee, Seoul (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/546,289

(22) Filed: Apr. 10, 2000

(30) Foreign Application Priority Data

Apr. 12, 1999 (KR) .................................................. 99-12824

(51) Int. Cl.[7] ...................... H01L 21/335; H01L 21/8232
(52) U.S. Cl. ............................................. 438/142; 438/253
(58) Field of Search .................................. 438/142, 164, 438/253, 275, 369, 448, 619, 255, 396, 397, 398, 586; 257/66, 347, 503, 758, 760, 774

(56) References Cited

U.S. PATENT DOCUMENTS

| | | |
|---|---|---|
| 4,728,623 | 3/1988 | Lu et al. . |
| 4,738,937 | 4/1988 | Parsons . |
| 4,918,029 | 4/1990 | Kim . |
| 5,004,702 | 4/1991 | Samata et al. . |
| 5,030,583 | 7/1991 | Beetz, Jr. et al. . |
| 5,032,538 | 7/1991 | Bozler et al. . |
| 5,045,494 | 9/1991 | Choi et al. . |
| 5,272,109 | 12/1993 | Motoda . |
| 5,322,802 | 6/1994 | Baliga et al. . |
| 5,322,814 | 6/1994 | Rouse et al. . |
| 5,378,652 | 1/1995 | Samata et al. . |
| 5,432,121 | 7/1995 | Chan et al. . |
| 5,435,856 | 7/1995 | Rouse et al. . |
| 5,494,837 | 2/1996 | Subramanian et al. . |
| 5,508,225 | 4/1996 | Kadoiwa . |
| 5,567,652 | 10/1996 | Nishio . |
| 5,599,724 | 2/1997 | Yoshida . |
| 5,627,102 | 5/1997 | Shinriki et al. . |
| 5,633,201 | 5/1997 | Choi . |
| 5,650,339 | * 7/1997 | Saito et al. ............................ 438/164 |
| 5,712,202 | * 1/1998 | Liaw et al. ............................ 438/253 |
| 5,744,377 | 4/1998 | Sekiguchi et al. . |
| 5,773,350 | 6/1998 | Herbert et al. . |
| 5,796,167 | * 8/1998 | Koga .................................... 257/758 |
| 5,804,470 | 9/1998 | Wollesen . |
| 5,808,362 | * 9/1998 | Davies et al. ........................ 257/758 |

FOREIGN PATENT DOCUMENTS

| | | |
|---|---|---|
| 54-158880 | 12/1979 | (JP) . |
| 2-37745 | 2/1990 | (JP) . |
| 2-260667 | 10/1990 | (JP) . |
| 8-236728 | 9/1996 | (JP) . |
| 10-107219 | 4/1998 | (JP) . |
| 11-97519 | 4/1999 | (JP) . |

* cited by examiner

*Primary Examiner*—David Nelms
*Assistant Examiner*—Phuc T. Dang
(74) *Attorney, Agent, or Firm*—Pennie & Edmonds LLP

(57) ABSTRACT

Method of manufacturing a semiconductor device according to the present invention comprises the steps of: sequentially forming a gate oxide layer, a gate and a mask insulation layer on a semiconductor substrate; sequentially forming first and second insulation layers on a resulting structure after forming the mask insulation layer; forming a first spacer on a side wall of the gate and the mask insulation layer having the first insulation layer by etching the second insulation layer; etching the first insulation layer so that an undercut is formed and the substrate of both sides of the first spacer and surface of the mask insulation layer are exposed, resulting from forming a second spacer on side wall of the gate and mask insulation layer; forming an epitaxial silicon layer on the exposed substrate; and forming elevated source and drain regions in the substrate by implanting an impurity ion through the epitaxial silicon layer and by performing annealing process.

21 Claims, 3 Drawing Sheets

METHOD OF MANUFACTURING A SEMICONDUCTOR DEVICE

BACKGROUND OF THE INVENTION

1. Field of the Invention

This invention relates to a method of manufacturing a semiconductor device, and more particularly to a method of forming an elevated source/drain of a semiconductor device.

2. Description of the Prior Art

FIGS. 1A to 1C are sectional views for explaining a conventional method of forming an elevated source/drain of a semiconductor device.

Referring to FIG. 1A, an isolation layer 12 to isolate between devices is formed on a semiconductor substrate 11. A gate oxide layer 13 is formed on the semiconductor substrate 11 in which the isolation layer 12 is formed. A polysilicon layer for a gate and a mask insulation layer are sequentially formed on a resulting structure after forming the gate oxide layer 13. The mask insulation layer, the polysilicon layer and the gate oxide layer 13 are patterned, thereby forming a gate 14 having the mask insulation layer 15.

Referring to FIG. 1B, a spacer insulation layer is formed on a structure of FIG. 1A and spacer 16 is formed on a sidewall of the gate 14 and the mask insulation layer 15 by means of a dry etching method. A native oxide layer formed on a surface of the semiconductor substrate 11 is removed by means of a wet cleaning method. An epitaxial silicon layer 17 is selectively grown on the substrate 11 exposed by the spacer 16 by a chemical vapor deposition. An impurity ion is implanted into the epitaxial silicon layer 17 and an annealing process is performed. Hence, the impurity ion is activated and diffused into the substrate 11 so that an elevated source and a drain region 18 are formed, as shown in FIG. 1C.

In the mean time, the dry etching method utilizes the plasma. The surface of the substrate 11 is excessively exposed to the plasma so that loss of the substrate 11 is occurred and a crystal lattice thereof is destroyed by the plasma damage. It is problem in that the initial growth of the epitaxial silicon layer is difficult and a facet is generated during the initial growth, whereby doping profile of the elevated source and drains 18 is not uniformed.

SUMMARY OF THE INVENTION

Therefore, it is an object of the invention to provide a method of manufacturing a semiconductor device that can solve and prevent crystal lattice destruction and the loss of the substrate due to etching for forming a spacer when forming the elevated source and drain.

To achieve the above object, a method of manufacturing a semiconductor device according to the present invention comprises the steps of:

sequentially forming a gate oxide layer, a gate and a mask insulation layer on a semiconductor substrate;

sequentially forming first and second insulation layers on a resulting structure after forming the mask insulation layer;

forming a first spacer on a side wall of the gate and the mask insulation layer having the first insulation layer by etching the second insulation layer;

etching the first insulation layer so that an undercut is formed and the substrate of both sides of the first spacer and surface of the mask insulation layer are exposed, whereby a second spacer is formed on side wall of the gate and mask insulation layer;

forming an epitaxial silicon layer on the exposed substrate; and forming elevated source and drain regions in the substrate by implanting an impurity ion through the epitaxial silicon layer and by performing annealing process.

BRIEF DESCRIPTION OF THE DRAWINGS

The aforementioned aspects and other features of the present invention will be explained in the following description, taken in conjunction with the accompanying drawing, wherein.

DETAILED DESCRIPTION OF THE INVENTION

FIGS. 2A to 2F are sectional views for explaining a method of manufacturing a semiconductor device according to the present invention.

Figure 1A:
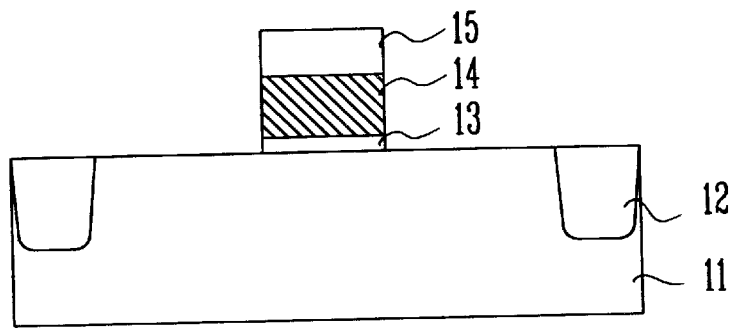
FIGS. 1A to 1C are sectional views for explaining a conventional method of manufacturing a semiconductor device.
Figure 1B:
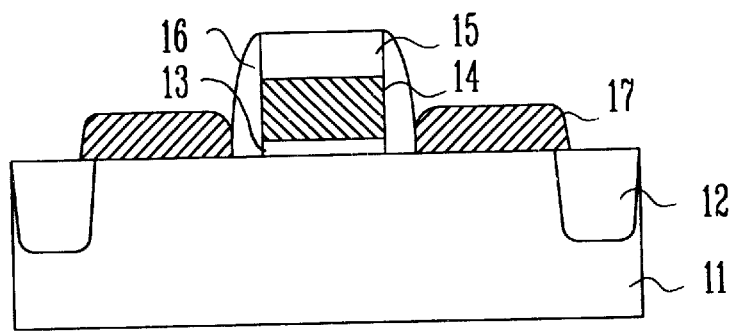
Figure 1C:
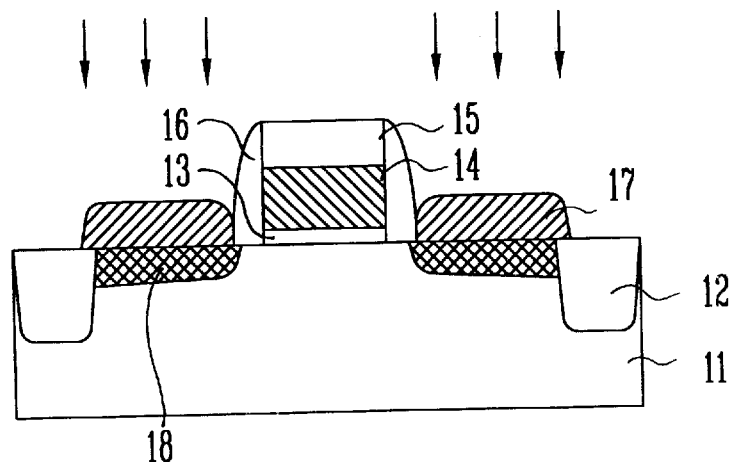
Figure 2A:
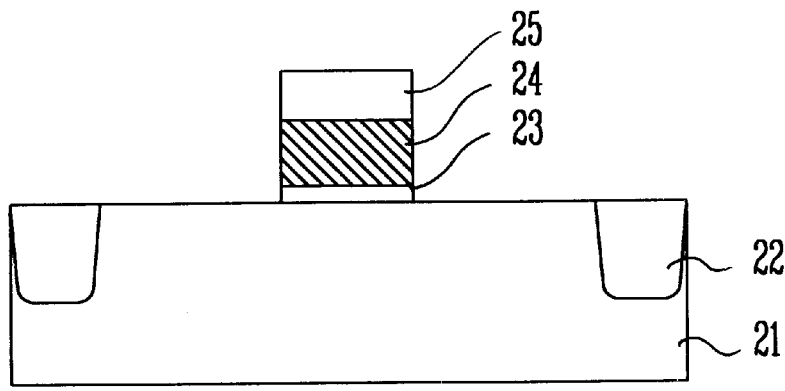
FIGS. 2A to 2F illustrate sectional views for explaining a method of manufacturing a semiconductor device according to the present invention.

Referring to FIG. 2A, an isolation layer 22 is formed on a semiconductor substrate 21 to isolate between devices. A gate oxide layer 23, a gate polysilicon layer and a mask insulation layer are sequentially formed on a resulting structure after forming the isolation layer 22. The mask insulation layer, the polysilicon layer and the gate oxide layer 23 are patterned so that a gate 24 having the mask insulation layer thereon is formed.

Figure 2B:
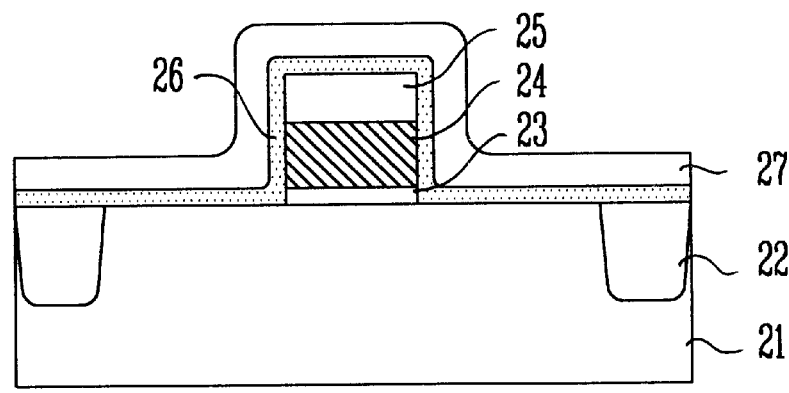

Referring to FIG. 2B, first and second insulation layers 26 and 27 are sequentially formed on a structure of FIG. 2A. It is desirable that the first insulation layer 26 is formed with an oxide layer having thickness of 50 through 150 Å and the second insulation layer 27 is formed with a nitride layer having thickness of 300 through 600 Å.

Figure 2C:
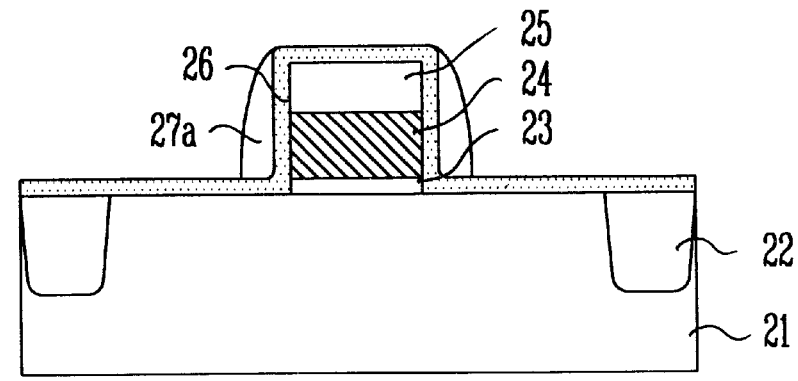

As shown in FIG. 2C, a first spacer 27a is formed on a side wall of a gate 24 and the mask insulation layer 25 having the first insulation layer 26 by etching the second insulation layer 27 by means of a dry etching method. The dry etching method is performed on over etching lower than 100%. The first insulation layer 26 acts as a protective layer to the substrate 21 when the second insulation layer 27 is dry etched, whereby crystal lattice destruction of the substrate 21 is prevented and a subsequent process becomes easy.

Figure 2D:
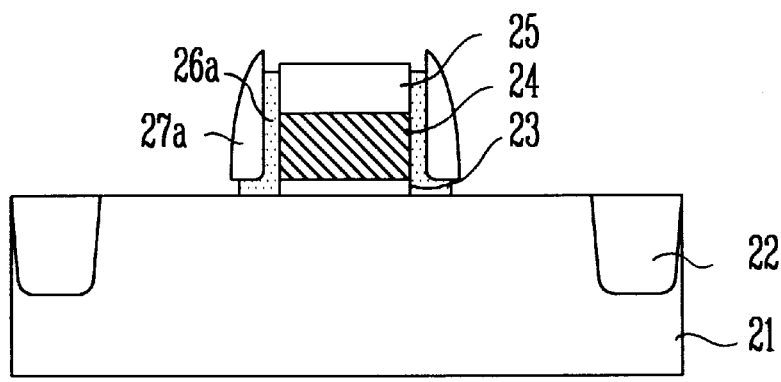

As shown in FIG. 2D, the first insulation layer 26 is etched by means of a wet etching method so that the substrate 21 on both side walls of the first spacer 27a and a surface of the mask insulation layer 25 are exposed, thereby forming a second spacer 26a on side wall of the gate and mask insulation layer 24 and 25. The wet etching method uses a RCA cleaning, an UV ozone cleaning or HF dipping, and is performed until an undercut having depth of below 100 Å is formed on a lower portion of the second spacer 26a. Also, the wet etching method may use a wet cleaning to remove a native oxide layer.

Figure 2E:
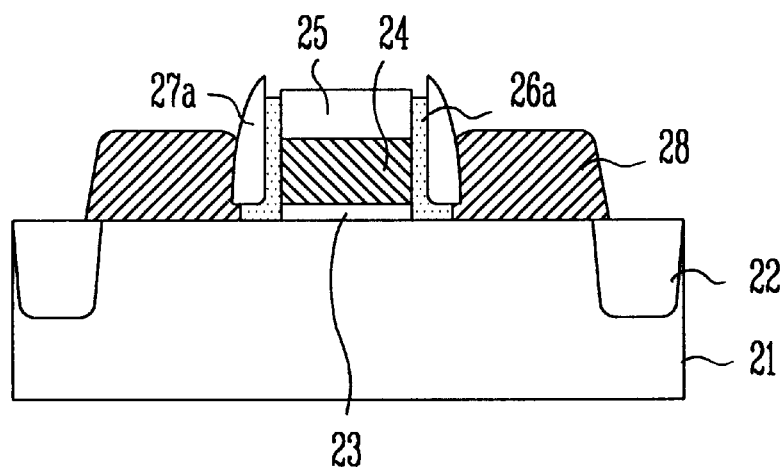

Referring to FIG. 2E, an epitaxial silicon layer 28 is selectively grew on the substrate 21 exposed on both sides of the first and second spacers 27a and 26a by means of a Low Pressure Chemical Vapor Deposition (LPCVD) or an Ultra High Vacuum Chemical Vapor Deposition (UHVCVD), wherein the epitaxial silicon layer 28 is formed with thickness of 500 through 2,000 Å. In case of using the Low Pressure Chemical Vapor Deposition (LPCVD), hydrogen baking is performed by in-situ method to prevent generation of an oxide layer between one through five minutes at temperature of 800 through 900 degree Celsius before forming the epitaxial silicon layer 28. Thereafter, the Low Pressure Chemical Vapor Deposition (LPCVD) is performed by deposition gases of DCS of 30 through 300 sccm and HCl of 30 through 200 sccm under pressure of 10 through 50 torr and temperature of 750 through 950 degree Celsius during 3 through 10 minutes. The Ultra High Vacuum Chemical Vapor Deposition (UHVCVD) is performed on condition of temperature of 600 through 700 degree Celsius and pressure of below 1 torr using deposition gases of silane or disilane. In growth of the epitaxial silicon layer, facet affecting initial facet determine is encroached in to a lower portion of the gate by the undercut generated on the lower portion of the second spacer 26a, thereby suppressing generation of the facet.

Figure 2F:
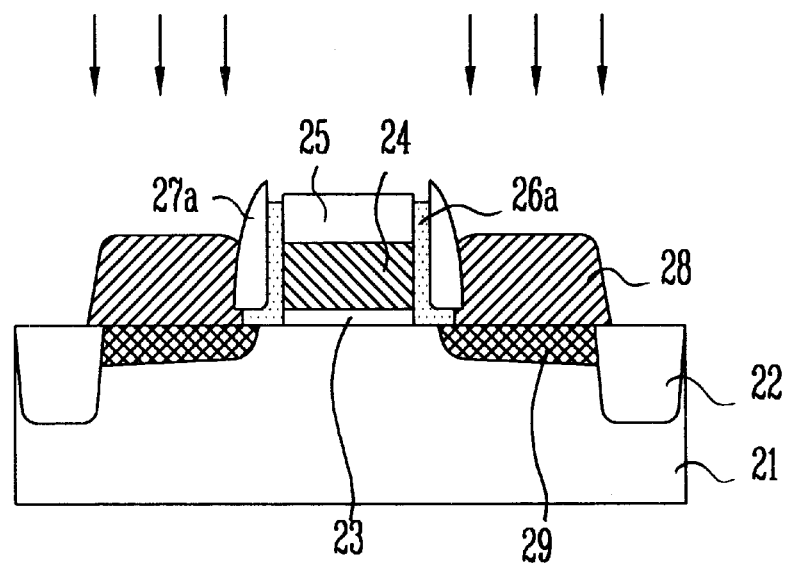

Referring to FIG. 2F, an impurity ion having concentration of $1 \times 10^{15}$ through $1 \times 10^{17}$ ion/cm$^2$ is implanted into the substrate through the epitaxial silicon layer and a furnace annealing process or a rapid thermal annealing is performed. The furnace annealing process is performed during 10 through 30 minutes on condition of $N_2$ gas environment and temperature of 800 through 950 degree Celsius. The rapid thermal annealing is performed during 1 through 30 seconds on condition of temperature of 900 through 1,050 degree Celsius and $N_2$ or $NH_3$ gases environment, in which ramp up temperature is 30 through 200 degree Celsius per second. By means of such an annealing process, the impurity ion is activated and diffused into the substrate, thereby forming elevated source and drain regions 29. When the elevated source and drain regions 29 are P-type, the impurity ion of B or $BF_2$ is implanted, while when the regions 29 are N-type, the impurity ion of As or P is implanted. It is desirable that B ion is implanted with energy of 5 through 50 KeV and $BF_2$ ion is implanted with energy of 10 through 100 KeV, As ion is implanted with energy of 10 through 100 KeV, P ion is implanted with energy of 10 through 70 KeV.

As described above, a side wall spacer of a gate is formed with double layers of first and second insulation layers and when dry etching of the second insulation layer, the substrate is protected by the first insulation layer, whereby damage and crystal lattice destruction of the substrate due to the etching are prevented and epitaxial growth becomes easy. Also, since generation of facet is suppressed by undercut positioned at lower portion of the spacer, it is possible to form the elevated source and drain regions having uniform impurity concentration profile. That is, manufacturing process is stabilized and device characteristic is improved.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a semiconductor device, comprising the steps of:
   sequentially forming a gate oxide layer, a gate and a mask insulation layer on a semiconductor substrate;
   sequentially forming first and second insulation layers on a resulting structure after forming said mask insulation layer;
   forming a first spacer on a side wall of said gate and said mask insulation layer having said first insulation layer by etching said second insulation layer;
   etching said first insulation layer so that an undercut is formed and said substrate of both sides of said first spacer and surface of said mask insulation layer are exposed, whereby a second spacer is formed on side wall of said gate and mask insulation layer;
   forming an epitaxial silicon layer on said exposed substrate; and
   forming elevated source and drain regions in said substrate by implanting an impurity ion through said epitaxial silicon layer and by performing an annealing process,
   wherein the source and drain regions are formed such that they are separated from the gate by the first and second spacers.

2. The method of claim 1, wherein said first insulation layer is formed of an oxide layer and said second insulation layer is formed of a nitride layer.

3. The method of claim 2, wherein said oxide layer is formed with thickness of 50 through 150 Å and said nitride layer is formed with 300 through 600 Å.

4. The method of claim 1, wherein said second insulation layer is etched by means of a dry etching method and said first insulation layer is etched by means of a wet etching method.

5. The method of claim 4, wherein said dry etching method is performed on over etching lower than 100%.

6. The method of claim 4, wherein said wet etching method is performed by a RCA cleaning, an UV ozone cleaning and a HF cleaning.

7. The method of claim 6, said wet etching method is performed until an undercut having depth of below 100 Å is formed on a lower portion of said second spacer.

8. The method of claim 1, wherein said epitaxial silicon layer is formed by means of a Low Pressure Chemical Vapor Deposition (LPCVD) or an Ultra High Vacuum Chemical Vapor Deposition (UHVCVD), with thickness of 500 through 2,000 Å.

9. The method of claim 8, wherein in case of using said Low Pressure Chemical Vapor Deposition (LPCVD), hydrogen baking is performed before forming said epitaxial silicon layer.

10. The method of claim 9, wherein said hydrogen baking is performed by in-situ method during one through five minutes at temperature of 800 through 900 degree Celsius.

11. The method of claim 9, wherein said Low Pressure Chemical Vapor Deposition (LPCVD) is performed by deposition gases of DCS of 30 through 300 sccm and HCl of 30 through 200 sccm under pressure of 10 through 50 torr and temperature of 750 through 950 degree Celsius during 3 through 10 minutes.

12. The method of claim 8, wherein said Ultra High Vacuum Chemical Vapor Deposition (UHVCVD) is performed on condition of temperature of 600 through 700 degree Celsius and pressure of below 1 torr using deposition gases of silane or disilane.

13. The method of claim 1, wherein said impurity ion is implanted with concentration of $1 \times 10^{15}$ through $1 \times 10^{17}$ ion/cm$^2$.

14. The method of claim 1, wherein said annealing process is a furnace annealing process or a rapid thermal annealing process.

15. The method of claim 14, wherein said furnace annealing process is performed during 10 through 30 minutes on condition of $N_2$ gas environment and temperature of 800 through 950 degree Celsius.

16. The method of claim 14, wherein said rapid thermal annealing process is performed during 1 through 30 seconds on condition of temperature of 900 through 1,050 degree Celsius and $N_2$ or $NH_3$ gases environment, in which the temperature is increased by 30 through 200 degree Celsius per second.

17. A method of manufacturing a semiconductor device, comprising the steps of:

sequentially forming a gate oxide layer, a gate and a mask insulation layer, thereby forming a resulting structure having a top surface on a semiconductor substrate;

sequentially forming first and second insulation layers said resulting structure;

dry etching said second insulation layer to form a first spacer on a side wall of said resulting structure having said first and second insulation layers;

wet etching said first insulation layer to expose the substrate on both sides of said first spacer and also expose the top surface of said mask insulation layer, thereby forming a second spacer, wherein said second spacer has an undercut formed on a lower portion thereof;

forming an epitaxial silicon layer on said exposed substrate; and implanting an impurity ion through said epitaxial silicon layer and performing an annealing process to form elevated source and drain regions which are separated from the gate by the first and second spacers.

18. The method of claim 17, wherein said first insulation layer is formed of an oxide layer and said second insulation layer is formed of a nitride layer.

19. The method of claim 17, wherein said dry etching is performed on over etching lower than 100%, and said wet etching is performed by a RCA cleaning, an ultraviolet ozone cleaning and a HF cleaning.

20. The method of claim 17, wherein said wet etching is performed until the undercut has a depth of below 100 Å.

21. A method of manufacturing a semiconductor device, comprising the steps of:

sequentially forming a gate oxide layer, a gate and a mask insulation layer to obtain a resulting structure having a top surface on a semiconductor substrate;

sequentially forming first and second insulation layers on said resulting structure;

forming a first spacer on a side wall of said gate and said mask insulation layer having said first insulation layer by dry etching said second insulation layer;

etching said first insulation layer with a wet etching to expose the substrate at both sides of said first spacer and the top surface of the mask insulation layer, thereby forming a second spacer, wherein said second spacer has an undercut formed at a lower portion thereof;

forming an epitaxial silicon layer on said exposed substrate; and forming elevated source and drain regions in said substrate by implanting an impurity ion through said epitaxial silicon layer and by performing an annealing process.

* * * * *